United States Patent
Zhong et al.

(10) Patent No.: US 12,467,132 B2
(45) Date of Patent: Nov. 11, 2025

(54) METHODS FOR DEPOSITING FILM LAYERS

(71) Applicant: Applied Materials, Inc., Santa Clara, CA (US)

(72) Inventors: Yaoying Zhong, Singapore (SG); Siew Kit Hoi, Singapore (SG); Haomin Xu, Singapore (SG); Li Ying Choo, Singapore (SG); Xiao Tan, Singapore (SG); Jay Min Soh, Singapore (SG)

(73) Assignee: Applied Materials Inc., Santa Clara, CA (US)

( * ) Notice: Subject to any disclaimer, the term of this patent is extended or adjusted under 35 U.S.C. 154(b) by 84 days.

(21) Appl. No.: 18/371,708

(22) Filed: Sep. 22, 2023

(65) Prior Publication Data

US 2025/0101575 A1    Mar. 27, 2025

(51) Int. Cl.
   C23C 14/02    (2006.01)
   C23C 16/04    (2006.01)
   C23C 16/12    (2006.01)

(52) U.S. Cl.
   CPC ............ C23C 16/045 (2013.01); C23C 16/12 (2013.01)

(58) Field of Classification Search
   CPC ... C23C 14/0021; C23C 14/02; C23C 14/228; C23C 14/345; H05H 1/24
   See application file for complete search history.

(56) References Cited

U.S. PATENT DOCUMENTS

| | | | |
|---|---|---|---|
| 6,482,477 B1* | 11/2002 | Westhoff | H01L 21/28556 427/535 |
| 6,676,800 B1* | 1/2004 | Festa | H01L 21/67028 134/1.1 |
| 7,901,545 B2 | 3/2011 | Cerio, Jr. et al. | |

(Continued)

FOREIGN PATENT DOCUMENTS

| | | | | |
|---|---|---|---|---|
| JP | 2625072 B2 * | 4/1997 | | H01L 21/3065 |
| JP | 3847866 B2 * | 11/2006 | | C23C 14/35 |

(Continued)

OTHER PUBLICATIONS

Brown, H.L., et al., "The impact of substrate bias on a remote plasma sputter coating process for conformal coverage of trenches and 3D structures". J. Phys. D: Appl. Phys. 48 (2015) 335303 pp. 1-10.*

(Continued)

*Primary Examiner* — Bret P Chen
(74) *Attorney, Agent, or Firm* — Moser Taboada

(57) ABSTRACT

A method for depositing a film layer on a substrate incorporates ion flux control to alter sputtering atom trajectories. A method may include flowing argon gas around a periphery of the substrate with a surface of the substrate having a plurality of structures with sidewalls and an edge region containing edge structures near the periphery of the substrate, forming a plasma to ionize the argon gas to form Ar+ ion flux to induce sputtering of aluminum to generate aluminum atoms for deposition on the substrate, generating an AC bias on the substrate to increase the Ar+ ion flux density at the edge region of the substrate to alter aluminum atom trajectories striking the edge region, and heating the substrate to increase mobility of the aluminum atoms deposited on the edge structures.

20 Claims, 5 Drawing Sheets

(56) References Cited

U.S. PATENT DOCUMENTS

| | | | |
|---|---|---|---|
| 8,298,936 | B1 | 10/2012 | Rozbicki et al. |
| 9,390,970 | B2 * | 7/2016 | Chiang ............ H01L 21/76879 |
| 11,037,768 | B2 | 6/2021 | Wang et al. |
| 11,674,216 | B2 | 6/2023 | Hoi et al. |
| 2004/0140052 | A1 | 7/2004 | Han |
| 2004/0140196 | A1 * | 7/2004 | Gopalraja ......... H01L 21/76877 |
| | | | 257/E21.585 |
| 2008/0000768 | A1 | 1/2008 | Stimson et al. |
| 2008/0083610 | A1 * | 4/2008 | Tang .................. H01J 37/3455 |
| | | | 204/192.1 |
| 2008/0318389 | A1 * | 12/2008 | Kim ..................... H01L 23/544 |
| | | | 257/E21.304 |
| 2010/0314245 | A1 * | 12/2010 | Brown ................. C23C 14/185 |
| | | | 204/192.15 |
| 2012/0080698 | A1 * | 4/2012 | Chu ..................... H10H 20/819 |
| | | | 257/E33.072 |
| 2012/0217221 | A1 * | 8/2012 | Hoffman ................ C23C 16/50 |
| | | | 216/61 |
| 2015/0069581 | A1 | 3/2015 | Chang et al. |
| 2015/0333012 | A1 * | 11/2015 | Chang ................ H01L 23/5283 |
| | | | 438/653 |
| 2021/0159073 | A1 | 5/2021 | Mutyala et al. |
| 2023/0313364 | A1 * | 10/2023 | Kashefi ................ C23C 14/046 |
| | | | 204/192.12 |

FOREIGN PATENT DOCUMENTS

| | | | |
|---|---|---|---|
| KR | 10-2020-0117337 A | 10/2020 | |
| WO | WO 02099838 A1 * | 12/2002 | ............. H01J 37/32 |

OTHER PUBLICATIONS

Bobzin, K., et al., "Pulse synchronized substrate bias for the High Power Pulsed Magnetron Sputtering deposition of CrAlN". Thin Solid Films, 732 (2021) 138792, pp. 1-13.*

Zhang, Silong, et al., "Effects of substrate bias voltage on structure and internal stress of amorphous carbon films on y-Fe substrate: Molecular dynamics simulation". Computational Materials Science, vol. 188, Feb. 15, 2021, 110206, pp. 1-11.*

Profijt, H.B., et al., "Substrate-biasing during plasma-assisted atomic layer deposition to tailor metal-oxide thin film growth". J. Vac. Sci. Technol. A 31, 01A106 (2013) pp. 1-9.*

International Search Report for PCT/US2024/047168, dated Dec. 31, 2024.

* cited by examiner

METHODS FOR DEPOSITING FILM LAYERS

FIELD

Embodiments of the present principles generally relate to semiconductor processing of semiconductor substrates.

BACKGROUND

During plasma deposition processes, the plasma may not be uniform, causing unequal sputtering of a target material onto a substrate. The inventors have observed that the nonuniform plasma distribution results in edge regions of the substrate having structures such as trenches and the like to have asymmetrical sidewall coverage.

Accordingly, the inventors have provided methods that improve structure coverage and also increase symmetrical sidewall coverage of structures in the edge regions of the substrate.

SUMMARY

Methods for improving deposition coverage and reduced asymmetrical sidewall coverage of structures in the edge region of a substrate are provided herein.

In some embodiments, a method for depositing a film layer on a substrate may comprise flowing an inert gas around a periphery of the substrate where the inert gas has a flow rate of approximately 10 sccm to approximately 3000 sccm, where a surface of the substrate has a plurality of structures with sidewalls, and where the substrate has an edge region containing edge structures near the periphery of the substrate, forming a plasma in a physical vapor deposition (PVD) process to ionize the inert gas to form an ion flux to induce sputtering of a metal material to form metal atoms for deposition on the substrate where the metal material has an ionization percentage of approximately three percent or less, generating an AC bias on the substrate to increase ion flux density at the edge region of the substrate to alter metal atom trajectories striking the edge region to increase sidewall coverage symmetry of the edge structures where the AC bias is approximately 100 watts to approximately 3000 watts, and heating the substrate to increase mobility of the metal atoms deposited on the edge structures and to increase deposition coverage where a temperature of the substrate is approximately 150 degrees Celsius to approximately 500 degrees Celsius.

In some embodiments, the method may further include depositing the metal material at a pressure of approximately 1.5 mTorr to approximately 14 mTorr, an AC bias with a frequency of approximately 13.56 MHZ, an inert gas that is argon and an ion flux that is comprised of Ar+, a metal material that is aluminum or copper, a temperature that is approximately 300 degrees Celsius with an AC bias that is approximately 800 watts and with a flow rate of an inert gas that is approximately 50 sccm to approximately 325 sccm, a plurality of structures that has openings with a depth of less than approximately 0.3 micrometers, a plurality of structures that have openings with a depth of approximately 0.8 micrometers, a substrate that has a plurality of dies on the surface of the substrate that contain the plurality of structures with sidewalls, at least one of the plurality of structures with sidewalls that is an alignment key for a photolithography process, and/or tuning sidewall coverage and diffusion properties of the metal material by adjusting the AC bias and temperature during deposition of the metal material on the substrate.

In some embodiments, a method for depositing a film layer on a substrate may comprise flowing argon gas around a periphery of the substrate where the argon gas has a flow rate of approximately 10 sccm to approximately 3000 sccm, where a surface of the substrate has a plurality of structures with sidewalls, and where the substrate has an edge region containing edge structures near the periphery of the substrate, forming a plasma in a physical vapor deposition (PVD) process to ionize the argon gas to form Ar+ ion flux to induce sputtering of aluminum to generate aluminum atoms for deposition on the substrate, generating an AC bias on the substrate to increase Ar+ ion flux density at the edge region of the substrate to alter aluminum atom trajectories striking the edge region to increase sidewall coverage symmetry of the edge structures where the AC bias is approximately 100 watts to approximately 3000 watts, and heating the substrate to increase mobility of the aluminum atoms deposited on the edge structures and to increase deposition coverage where a temperature of the substrate is approximately 150 degrees Celsius to approximately 500 degrees Celsius.

In some embodiments, the method may further include depositing aluminum at a pressure of approximately 1.5 mTorr to approximately 14 mTorr, an AC bias with a frequency of approximately 13.56 MHz, a temperature that is approximately 300 degrees Celsius with an AC bias that is approximately 800 watts and with a flow rate of the argon gas that is approximately 50 sccm to approximately 325 sccm, a substrate that has a plurality of dies on the surface of the substrate that contain the plurality of structures with sidewalls, at least one of the plurality of structures with sidewalls that is an alignment key for a photolithography process, and/or tuning sidewall coverage and diffusion properties of the aluminum by adjusting the AC bias and temperature during deposition of the aluminum on the substrate.

In some embodiments, a non-transitory, computer readable medium having instructions stored thereon that, when executed, cause a method for depositing a film layer on a substrate, the method may comprise flowing argon gas around a periphery of the substrate where the argon gas has a flow rate of approximately 10 sccm to approximately 3000 sccm, where a surface of the substrate has a plurality of structures with sidewalls, and where the substrate has an edge region containing edge structures near the periphery of the substrate, forming a plasma in a physical vapor deposition (PVD) process to ionize the argon gas to form Ar+ ion flux to induce sputtering of aluminum to generate aluminum atoms for deposition on the substrate, generating an AC bias on the substrate to increase Ar+ ion flux density at the edge region of the substrate to alter aluminum atom trajectories striking the edge region to increase sidewall coverage symmetry of the edge structures where the AC bias is approximately 100 watts to approximately 3000 watts, and heating the substrate to increase mobility of the aluminum atoms deposited on the edge structures and to increase deposition coverage where a temperature of the substrate is approximately 150 degrees Celsius to approximately 500 degrees Celsius.

In some embodiments, the method of the non-transitory, computer readable medium may further include depositing the aluminum at a pressure of approximately 1.5 m Torr to approximately 14 mTorr.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
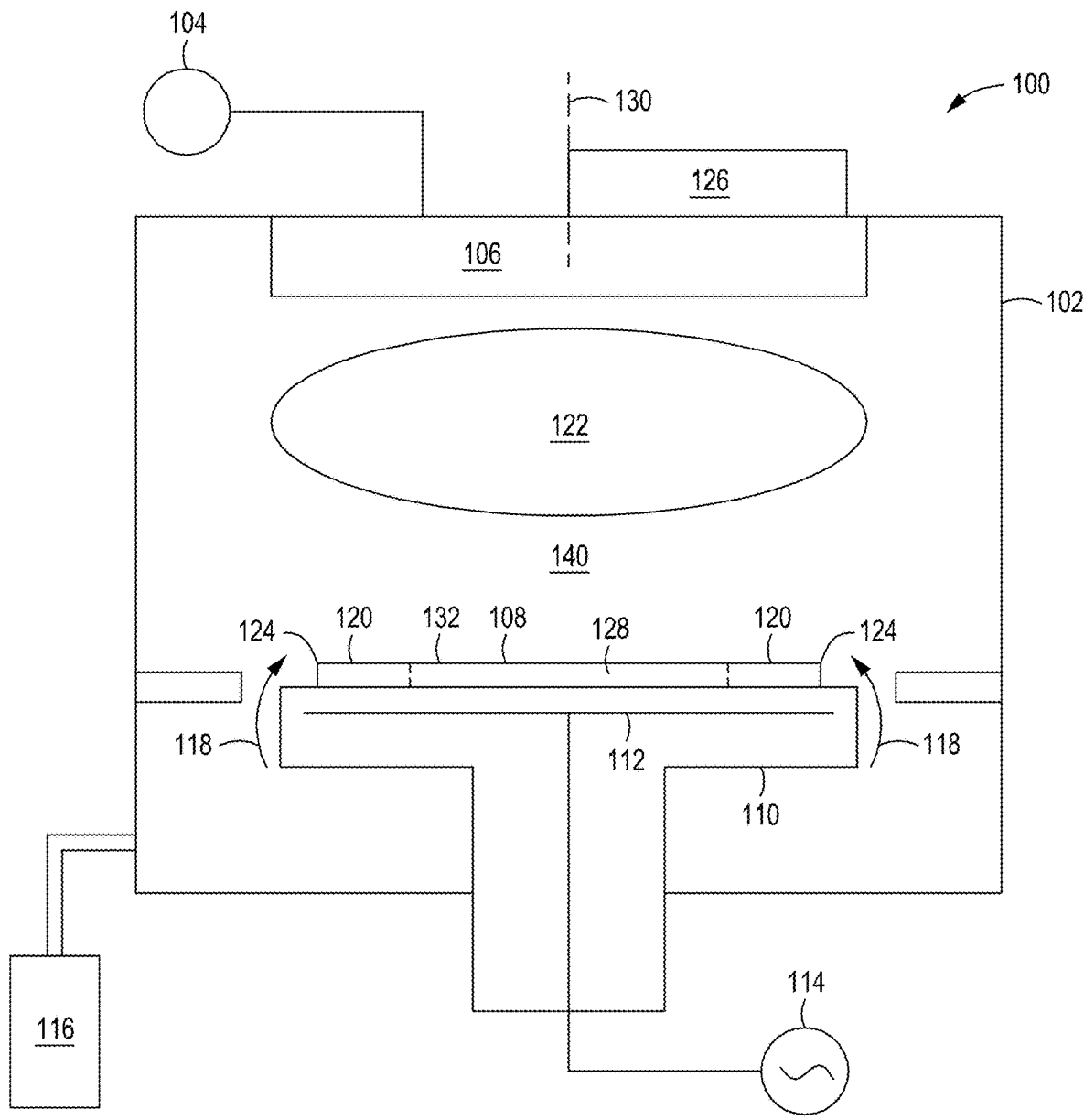
FIG. 1 depicts a schematic cross-sectional view of a physical vapor deposition (PVD) chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide improved deposition processes. By tuning the parameters of the deposition process, the coverage of the deposition and the symmetrical sidewall coverage is enhanced over traditional techniques. Accurate control of the deposition trajectory guides the deposition to improve symmetry of the sidewall coverage of structures such as trenches and the like near edge regions of a substrate. The energy of the deposition adatoms is also increased to provide improved adatom diffusion during deposition to increase coverage and sidewall symmetry by allowing the adatoms to move into the structures without forming seams.

In some manufacturing processes, a substrate may be formed with many dies on the substrate surface. The dies may contain structures with sidewalls such as trenches and the like. During processing of the substrate, a deposition process may be used to deposit materials, such as metal materials, over the surface of the substrate. If a chamber produces nonuniform plasma within the processing volume of the chamber, the deposition particles from a sputtering target may have varying densities and trajectories that strike the surface of the substrate at less-than-optimal angles near the edge regions of the substrate. Traditional attempts to mitigate the problems included changing the source magnets, redesigning the chamber, and the like. However, the traditional attempts only slightly improved the sidewall and bottom coverage of the structures at the expense of reduced overall coverage. The methods of the present principles substantially improve symmetrical sidewall coverage of the structures while simultaneously improving overall deposition coverage.

The negative effects of asymmetrical sidewall coverage of metal depositions such as aluminum, copper, and the like, becomes evident in various downstream processes. For example, overlay issues may result during lithography processes which can eventually reduce the overall yield due to misalignments and the like. In some embodiments of the present techniques, an inert gas ion flux, such as but not limited to, argon ions (Ar+) are used to alter the sputtered atom trajectories to induce symmetrical coverage on sidewalls of structures in the edge regions of the substrate. The inert gas ion flux is also used to increase the mobility of the sputtered atoms after contact with the surface of the substrate to increase symmetrical coverage and overall coverage. The controlled ion flux helps to mitigate edge region sidewall asymmetry induced by the uneven distribution of plasma and sputtered atom trajectories in the substrate's edge region. The present techniques introduce an AC bias on the substrate to influence the trajectories of the inert gas ion flux and the sputtered atoms in the edge regions. The temperature of the substrate may also be increased to further increase the mobility of the sputtered atoms on the substrate to enhance sidewall symmetry and overall deposition coverage.

In some embodiments, the methods of the present principles may be performed, for example but not limited to, a physical vapor deposition (PVD) chamber 100 as depicted in FIG. 1. Walls 102 of the PVD chamber 100 enclose a processing volume 140 where deposition of film material on a substrate 108 may occur. The substrate 108 is supported by a pedestal 110 that includes a biasing electrode 112 electrically connected to an AC bias power source 114. An inert gas source 116 supplies inert gas into the processing volume 140. The inert gas flows 118 up and around the periphery 124 of the substrate 108 and into the processing volume 140 during deposition. The substrate 108 has a surface 132 that includes a center region 128 and an edge region 120. A DC power source 104 supplies power to a target 106 to generate a plasma 122 in the processing volume 140 during deposition. In some embodiments, the target may be a metal material such as aluminum, copper, and the like. The target 106, when sputtered, deposits the metal material onto the substrate 108 as a deposition film layer. A magnetron 126 rotates around a central axis 130 during deposition to enhance sputtering of the target 106.

Figure 2:
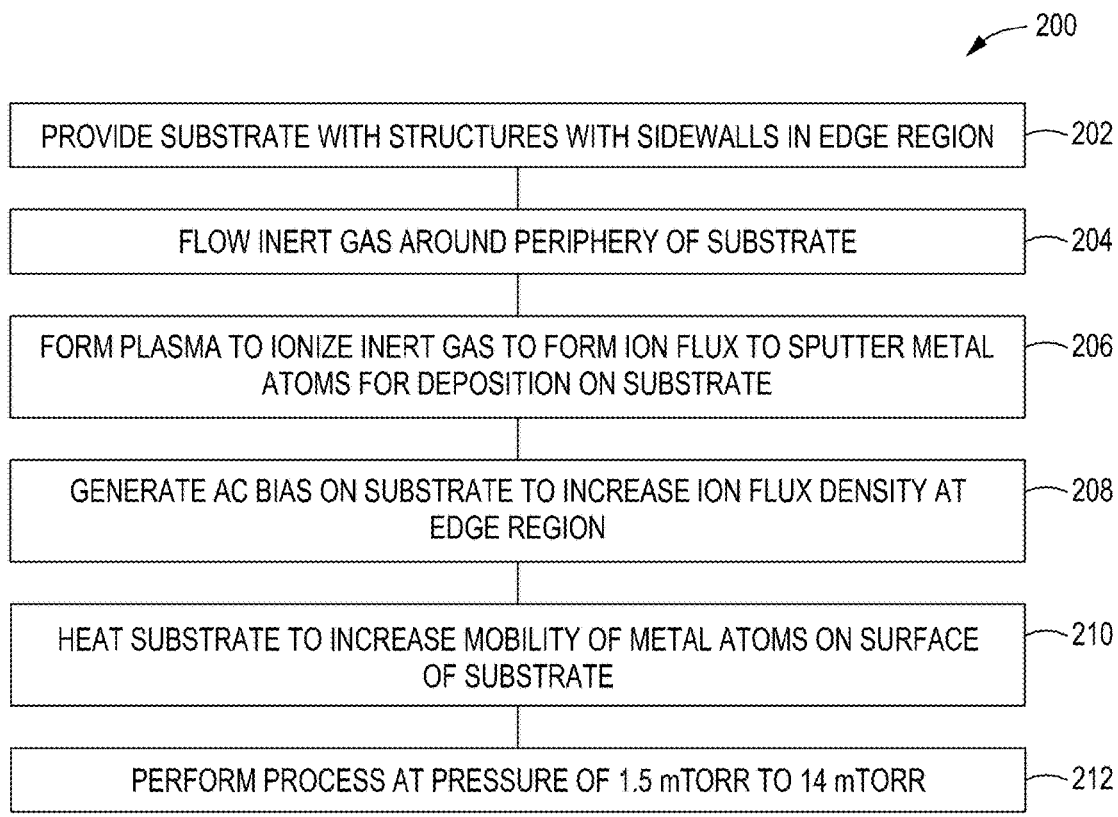
FIG. 2 is a method for depositing a film layer in accordance with some embodiments of the present principles.
Figure 3:
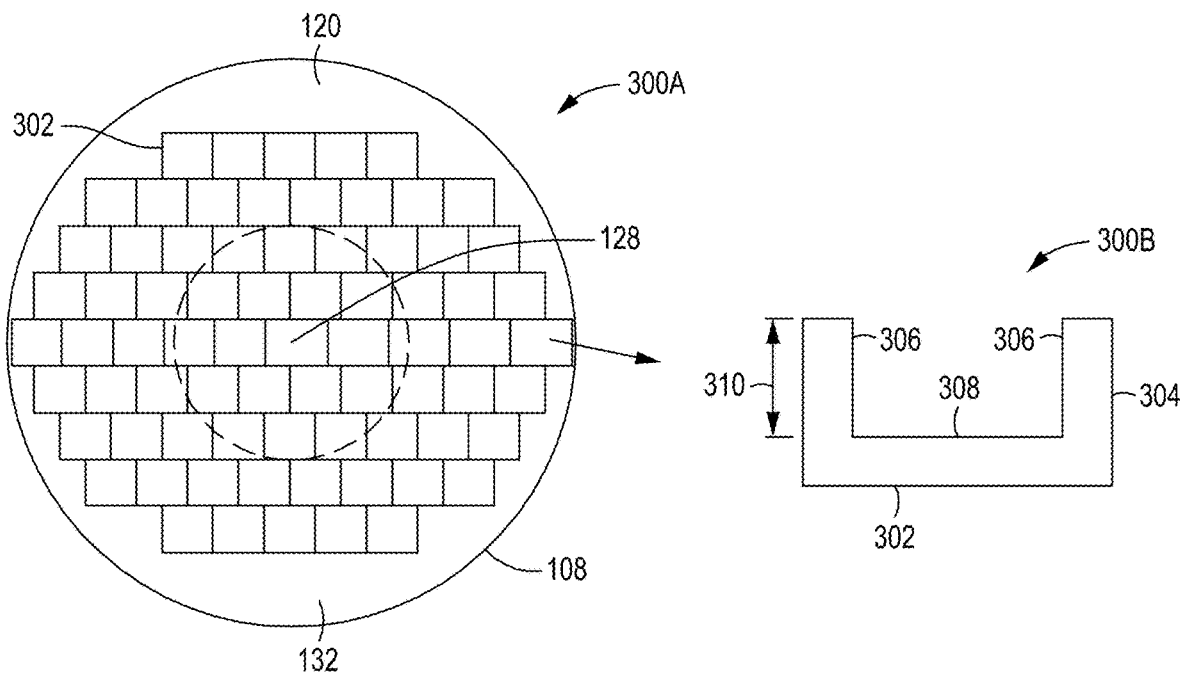
FIG. 3 depicts a cross-sectional view of a structure and a top-down view of substrate with a plurality of dies in accordance with some embodiments of the present principles.

FIG. 2 is a method 200 for depositing a film layer on a substrate. References will be made to FIGS. 1 and 3-8 for the discussion of the method 200. In block 202, the substrate 108 is provided with structures with sidewalls, in at least, the edge region 120 of the substrate 108. In some embodiments, a plurality of dies 302 is formed on the surface 132 of the substrate 108 as depicted in a view 300A of FIG. 3. As stated above, the method 200 enhances deposition on openings of structures, especially in the edge region 120 of the substrate 108. The plurality of dies 302 include structures 304 with sidewalls 306 and a bottom 308 as depicted in a view 300B of FIG. 3. In some embodiments, the structures 304 may be shallow (e.g., a depth 310 of approximately 0.3 micrometers or less, etc.) or deep trenches (the depth 310 of approximately 0.8 micrometers or more, etc.) and the like. In some embodiments, the structures 304 may be an alignment key for a photolithography process.

Figure 4:
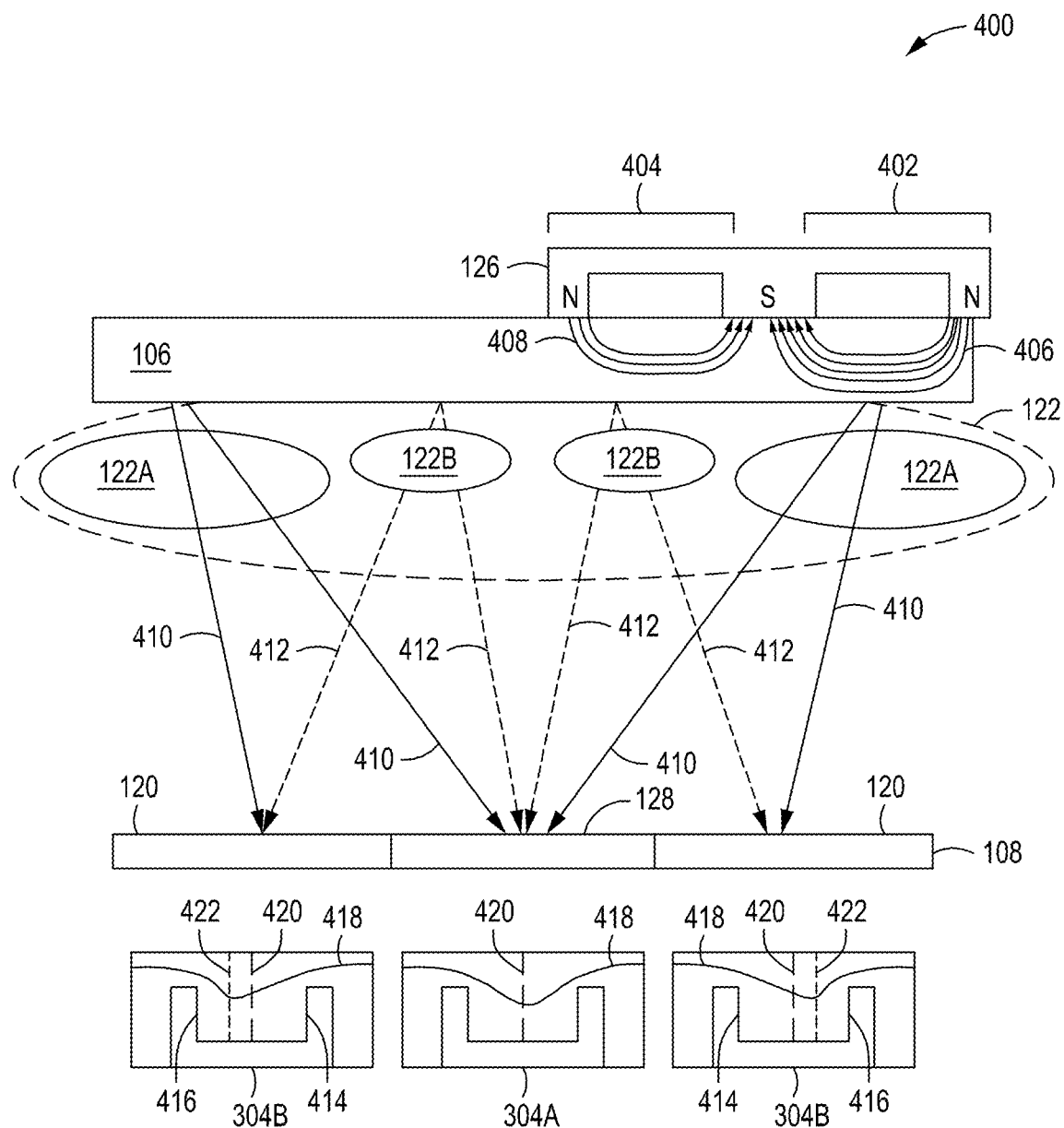
FIG. 4 depicts a cross-sectional view of a PVD deposition process in accordance with some embodiments of the present principles.

As depicted in a view 400 of FIG. 4, during deposition onto the substrate 108, the plasma 122 has nonuniform density. Denser plasma regions are denoted by 122A and less dense plasma regions are denoted by 122B. The varying plasma density is a result of the magnetic fields generated by the magnetron 126. The outer portion 402 of the magnetron 126 generates higher density magnetic field lines 406 than the less dense magnetic field lines 408 of the inner portion 404. The denser plasma regions 122A generate dense target particles 410 (e.g., metal atoms) to deposit on the substrate 108, while the less dense plasma regions 122B generate less dense target particles 412 to deposit on the substrate 108. The center region 128 of the substrate 108 has deposition from both the dense target particles 410 and the less dense target particles 412 alike from all directions. The structures 304A of the center region 128 have symmetrical sidewall coverage within the structures 304A. The edge region 120 of the substrate 108 has deposition predominantly from the dense target particles 410 on the inward sidewall 414 and from the less dense target particles 412 on the outward sidewall 416, creating asymmetrical sidewall coverage by the deposited film 418. For downstream processes that utilize the minimum film depth as a center point 420 of the structure 304, the asymmetry of the sidewall coverage causes a shift 422 in the minimum film depth point, leading to alignment errors and the like.

Figure 5:
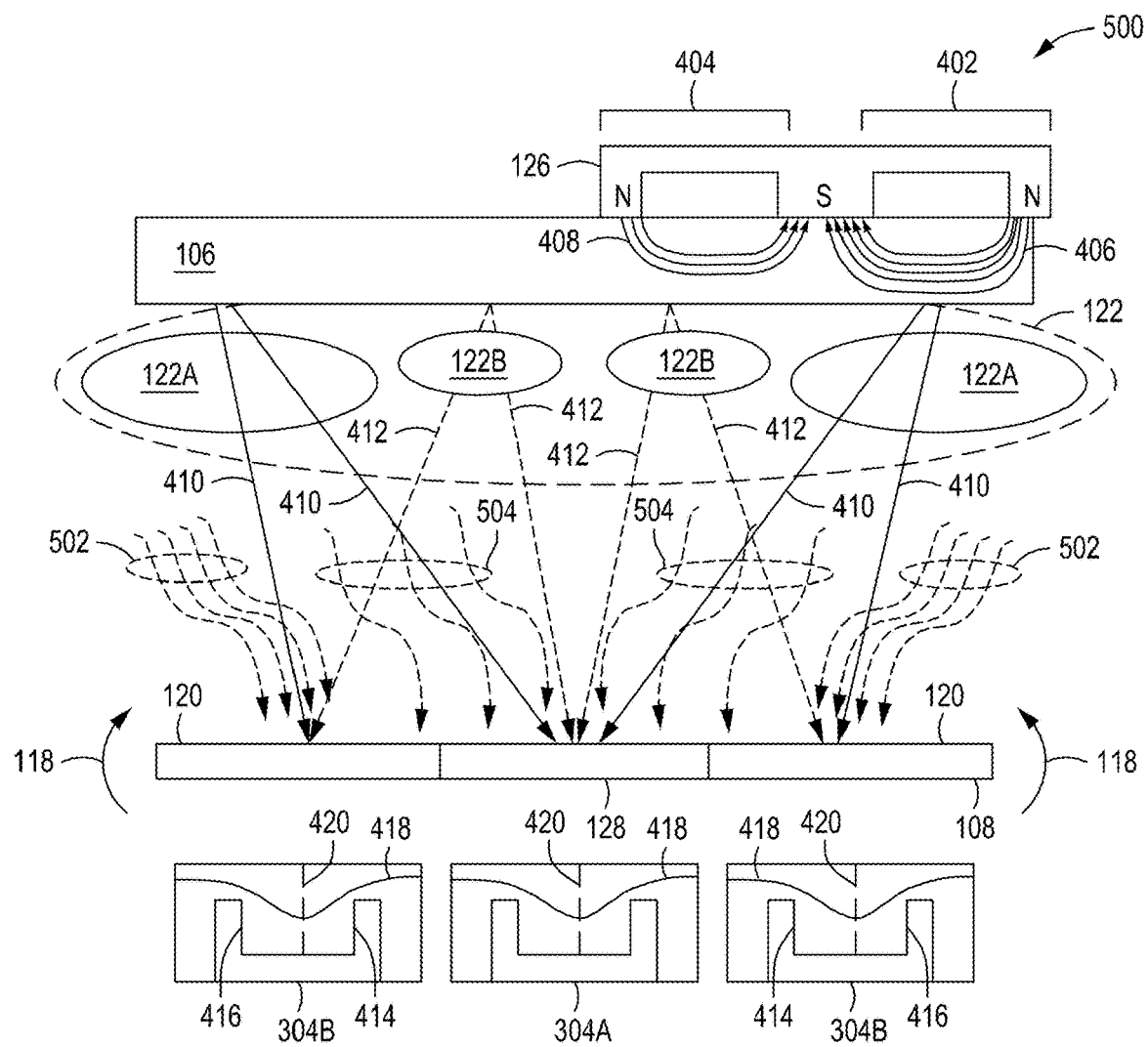
FIG. 5 depicts a cross-sectional view of a PVD deposition process incorporating the present principles in accordance with some embodiments of the present principles.
Figure 6:
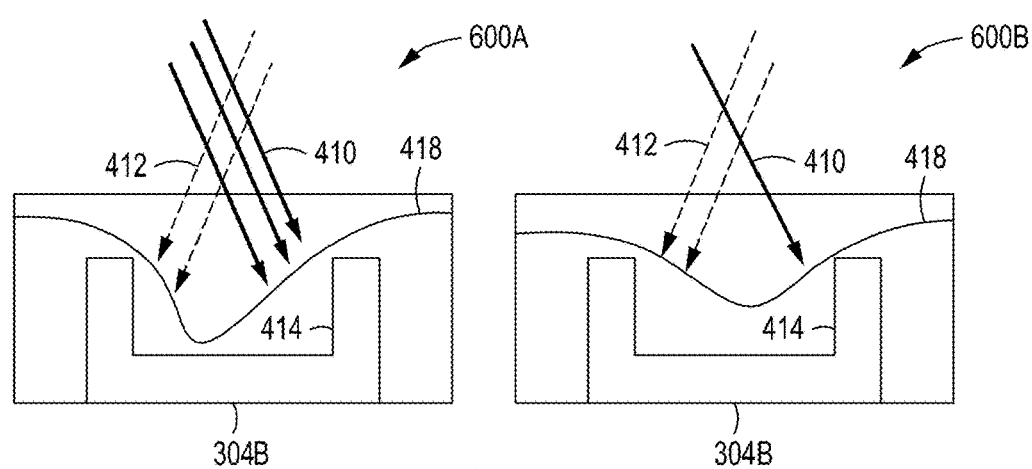
FIG. 6 depicts cross-sectional views of a deposition film layer on a structure in accordance with some embodiments of the present principles.

In block 204, the inert gas flows 118 around the periphery 124 of the substrate 108 as depicted in the PVD chamber 100 of FIG. 1 and a view 500 of FIG. 5. In some embodiments, the inert gas may be argon and the like. In some embodiments, the flow rate of the inert gas may be from approximately 10 sccm to approximately 3000 sccm. In some embodiments, the flow rate may be from approximately 50 sccm to approximately 325 sccm. In some embodiments, the flow rate may be 70 sccm, 160 sccm, or 320 sccm. As depicted in a view 600A of FIG. 6, the sidewall asymmetry coverage is caused predominantly by the dense target particles 410 striking the inward sidewall 414. The flow rate of the inert gas can be adjusted to deflect a portion of the dense target particles 410 to keep some of the dense target particles 410 from depositing on the inward sidewall 414 as depicted in a view 600B of FIG. 6. The reduction of dense target particles 410 striking the inward sidewall 414 aids in achieving sidewall symmetrical coverage.

In block 206, the plasma 122 is formed to ionize the inert gas to form ion flux to sputter metal atoms for deposition on the substrate 108. A portion of the ion flux will strike the target 106 and cause sputtering of the target 106 in which metal atoms are released and travel towards the substrate 108 as part of the deposition process. Another portion of the ion flux travels towards the substrate 108 in a random fashion. In some embodiments, the target is a metallic material with a low ionization percentage of less than approximately three percent. The low ionization percentage allows for the majority of the ionized particles to be from the inert gas rather than from the metal material. High ionization metal materials produce more metal particles that may interfere with the present methods, as the high ionization may be too great to offset with the inert gas ionization flux and other techniques discussed below.

In block 208, an AC bias is generated on the substrate 108 to precisely control the ion energy and the ion flux density at the edge region 120 of the substrate 108 as depicted in FIG. 5. The AC bias causes a high energy and a high-density ion flux 502 in the edge region 120 and a low-density ion flux 504 in the center region 128. As depicted in a view 700A of FIG. 7, the high-density ion flux 502 causes a reduction in dense target particles 410 from striking the inward sidewall 414 (less deposition), increasing symmetrical sidewall coverage. The high-density ion flux 502 also facilitates increasing the mobility 702 of the deposited metal atoms on the surface 132 of the substrate 108 to promote surface diffusion. In some embodiments, the AC bias may have a frequency of approximately 13.56 MHz. In some embodiments, the AC bias power may be from approximately 100 watts to approximately 3000 watts. In some embodiments, the AC bias power may be approximately 800 watts. The inventors have found that increasing the DC power supplied to the target has little to no effect on the sidewall asymmetrical coverage.

Figure 7:
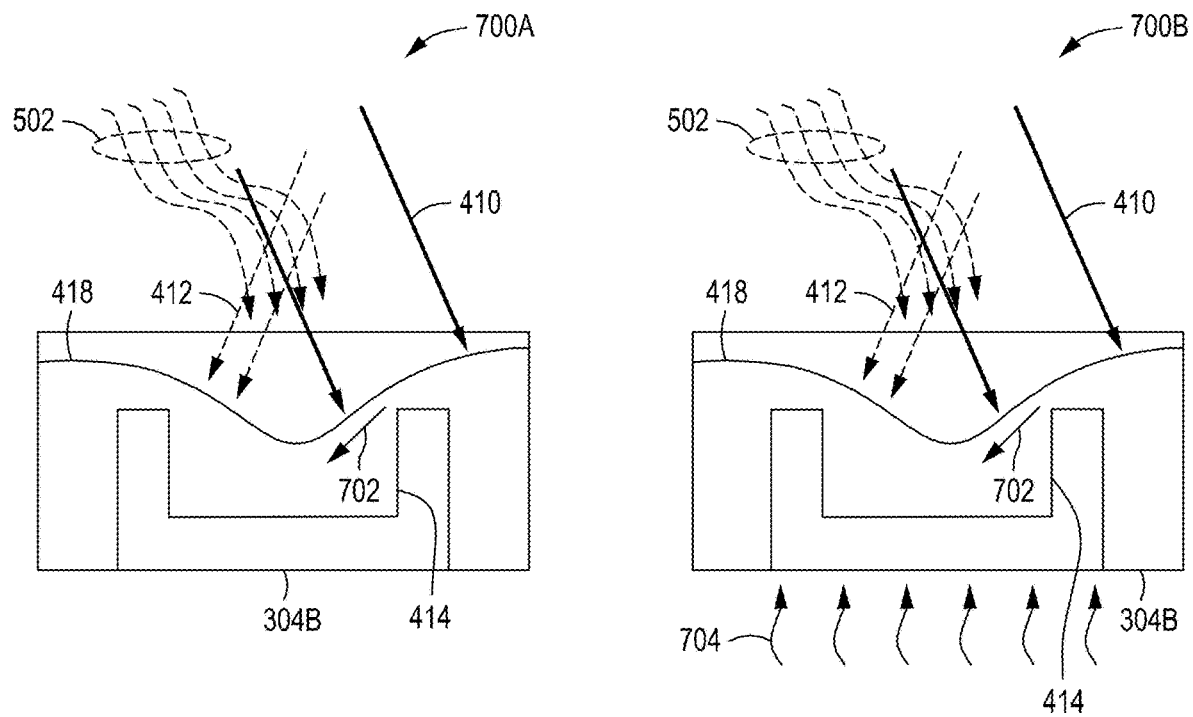
FIG. 7 depicts cross-sectional views of a deposition film layer on a structure with AC bias and a heated substrate in accordance with some embodiments of the present principles.

In block 210, the substrate 108 is heated 704 to further increase the mobility 702 of the metal atoms on the surface 132 of the substrate 108 to promote surface diffusion as depicted in a view 700B of FIG. 7. In some embodiments, the substrate 108 may be heated from approximately 150 degrees Celsius to approximately 500 degrees Celsius. In some embodiments, the substrate 108 may be heated to approximately 300 degrees Celsius. Higher temperatures cause higher mobility of the metal atoms on the surface 132 but the temperatures are constrained at the upper limit by the metal material melting point. The thermal budget of the structures 304 on the substrate 108 may also further constrain the upper limit of the temperature range. The higher mobility of the metal atoms allows the atoms to have enough energy to diffuse into the existing materials already deposited on the surface 132. The increased mobility allows the atoms to flow into the structure 304 and increase symmetrical sidewall coverage rather than just accumulating on the inward sidewall 414. In block 212, the pressure of the process is performed at approximately 1.5 mTorr to approximately 14 mTorr. Adjusting the process pressure allows for further control of the inert gas flux and sidewall coverage.

Figure 8:
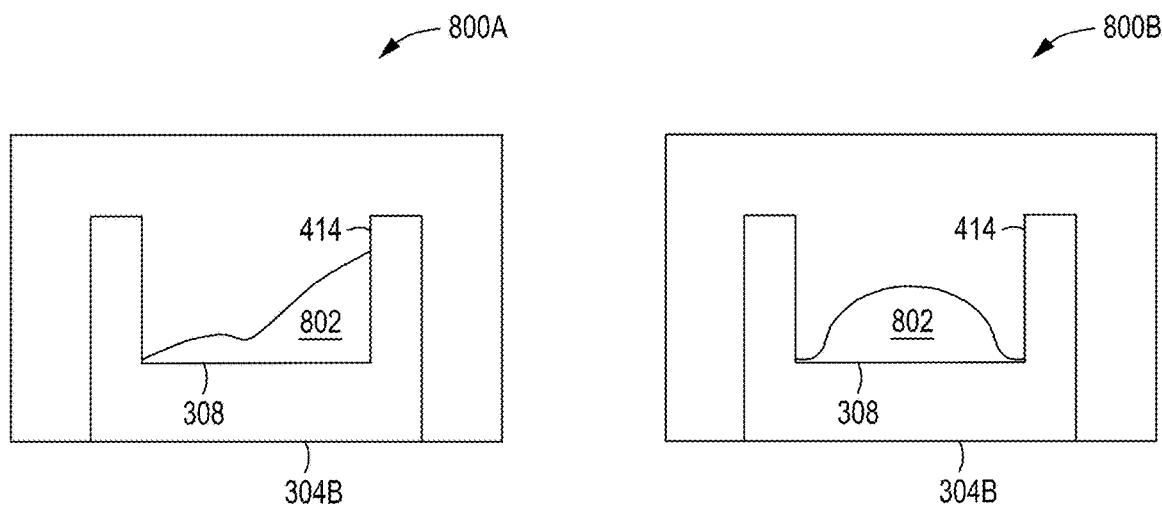
FIG. 8 depicts cross-sectional views of a deposition film layer on a bottom surface of a structure in accordance with some embodiments of the present principles.

In some embodiments, the AC bias can be used to tune the ion flux while the temperature can be used to promote surface diffusion. In some embodiments, the AC bias may be approximately 800 watts, the temperature may be approximately 300 degrees Celsius, and the flow rate of the inert gas (argon) may be approximately 50 sccm to approximately 325 sccm for the deposition of aluminum onto a substrate to achieve symmetrical sidewall coverage in the edge region. The method 200 above may also be used for deep trench structures where the goal is to evenly deposit metal material on the bottom 308 of the structure 304B as depicted in FIG. 8. Structures 304B in the edge region 120 will have the deposition material 802 biased to the inward sidewall 414 as depicted in a view 800A of FIG. 8. By utilizing the above method 200, the bottom deposition can be used to center the deposition material 802 on the bottom 308 as depicted in a view 800B of FIG. 8.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for depositing a film layer on a substrate, comprising:

flowing an inert gas up and around a periphery of the substrate, wherein the inert gas has a flow rate of approximately 10 sccm to approximately 3000 sccm, wherein a surface of the substrate has a plurality of structures with sidewalls, and wherein the substrate has an edge region containing edge structures near the periphery of the substrate;

forming a plasma in a physical vapor deposition (PVD) process to ionize the inert gas that is flowing during deposition to form an ion flux to induce sputtering of a metal material to form metal atoms for deposition on the substrate, wherein the metal material has an ionization percentage of approximately three percent or less;

generating an AC bias on the substrate to increase ion flux density at the edge region of the substrate to alter metal atom trajectories striking the edge region to increase sidewall coverage symmetry of outward sidewalls of the edge structures, wherein the AC bias is approximately 100 watts to approximately 3000 watts; and heating the substrate to increase mobility of the metal atoms deposited on the edge structures and to increase deposition coverage, wherein a temperature of the substrate is approximately 150 degrees Celsius to approximately 500 degrees Celsius.

2. The method of claim 1, further comprising:
depositing the metal material at a pressure of approximately 1.5 mTorr to approximately 14 m Torr.

3. The method of claim 1, wherein the AC bias has a frequency of approximately 13.56 MHz.

4. The method of claim 1, wherein the inert gas is argon and the ion flux is comprised of Ar+.

5. The method of claim 1, wherein the metal material is aluminum or copper.

6. The method of claim 1, wherein the temperature is approximately 300 degrees Celsius, the AC bias is approximately 800 watts, and the flow rate of the inert gas is approximately 50 sccm to approximately 325 sccm.

7. The method of claim 1, wherein the plurality of structures has openings with a depth of less than approximately 0.3 micrometers.

8. The method of claim 1, wherein the plurality of structures have openings with a depth of approximately 0.8 micrometers.

9. The method of claim 1, wherein the substrate has a plurality of dies on the surface of the substrate that contain the plurality of structures with sidewalls.

10. The method of claim 1, wherein at least one of the plurality of structures with sidewalls is an alignment key for a photolithography process.

11. The method of claim 1, further comprising:
tuning sidewall coverage and diffusion properties of the metal material by adjusting the AC bias and temperature during deposition of the metal material on the substrate.

12. A method for depositing a film layer on a substrate, comprising:

flowing argon gas up and around a periphery of the substrate, wherein the argon gas has a flow rate of approximately 10 sccm to approximately 3000 sccm, wherein a surface of the substrate has a plurality of structures with sidewalls, and wherein the substrate has an edge region containing edge structures near the periphery of the substrate;

forming a plasma in a physical vapor deposition (PVD) process to ionize the argon gas that is flowing during deposition to form Ar+ ion flux to induce sputtering of aluminum to generate aluminum atoms for deposition on the substrate;

generating an AC bias on the substrate to increase Ar+ ion flux density at the edge region of the substrate to alter aluminum atom trajectories striking the edge region to increase sidewall coverage symmetry of outward sidewalls of the edge structures, wherein the AC bias is approximately 100 watts to approximately 3000 watts; and heating the substrate to increase mobility of the aluminum atoms deposited on the edge structures and to increase deposition coverage, wherein a temperature of the substrate is approximately 150 degrees Celsius to approximately 500 degrees Celsius.

13. The method of claim 12 further comprising:
depositing the aluminum at a pressure of approximately 1.5 mTorr to approximately 14 m Torr.

14. The method of claim 12, wherein the AC bias has a frequency of approximately 13.56 MHz.

15. The method of claim 12, wherein the temperature is approximately 300 degrees Celsius, the AC bias is approximately 800 watts, and the flow rate of the argon gas is approximately 50 sccm to approximately 325 sccm.

16. The method of claim 12, wherein the substrate has a plurality of dies on the surface of the substrate that contain the plurality of structures with sidewalls.

17. The method of claim 12, wherein at least one of the plurality of structures with sidewalls is an alignment key for a photolithography process.

18. The method of claim 12, further comprising:
tuning sidewall coverage and diffusion properties of the aluminum by adjusting the AC bias and temperature during deposition of the aluminum on the substrate.

19. A non-transitory, computer readable medium having instructions stored thereon that, when executed, cause a method for depositing a film layer on a substrate, the method comprising:

flowing argon gas up and around a periphery of the substrate, wherein the argon gas has a flow rate of approximately 10 sccm to approximately 3000 sccm, wherein a surface of the substrate has a plurality of structures with sidewalls, and wherein the substrate has an edge region containing edge structures near the periphery of the substrate;

forming a plasma in a physical vapor deposition (PVD) process to ionize the argon gas that is flowing during deposition to form Ar+ ion flux to induce sputtering of aluminum to generate aluminum atoms for deposition on the substrate;

generating an AC bias on the substrate to increase Ar+ ion flux density at the edge region of the substrate to alter aluminum atom trajectories striking the edge region to increase sidewall coverage symmetry of outward sidewalls of the edge structures, wherein the AC bias is approximately 100 watts to approximately 3000 watts; and heating the substrate to increase mobility of the aluminum atoms deposited on the edge structures and to increase deposition coverage, wherein a temperature of the substrate is approximately 150 degrees Celsius to approximately 500 degrees Celsius.

20. The non-transitory, computer readable medium of claim 19, the method further comprising:

depositing the aluminum at a pressure of approximately 1.5 mTorr to approximately 14 m Torr.

\* \* \* \* \*